(12) United States Patent
Nakayama et al.

(10) Patent No.: US 11,969,919 B2
(45) Date of Patent: Apr. 30, 2024

(54) METHOD OF MANUFACTURING SENSOR

(71) Applicant: OMRON Corporation, Kyoto (JP)

(72) Inventors: Yusuke Nakayama, Kameoka (JP); Daisuke Inoue, Ayabe (JP); Yuki Ushiro, Ayabe (JP); Takaaki Sanda, Fukuchiyama (JP); Hiroto Katsura, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 454 days.

(21) Appl. No.: 17/287,106

(22) PCT Filed: Nov. 6, 2019

(86) PCT No.: PCT/JP2019/043416
§ 371 (c)(1),
(2) Date: Apr. 20, 2021

(87) PCT Pub. No.: WO2020/100676
PCT Pub. Date: May 22, 2020

(65) Prior Publication Data
US 2021/0394402 A1 Dec. 23, 2021

(30) Foreign Application Priority Data
Nov. 12, 2018 (JP) .................................. 2018-212390

(51) Int. Cl.
*B29C 37/00* (2006.01)
*B29L 31/34* (2006.01)

(52) U.S. Cl.
CPC ... *B29C 37/0053* (2013.01); *B29L 2031/3481* (2013.01)

(58) Field of Classification Search
CPC . B29C 44/58; B29C 45/1615; B29C 45/2612; B29C 2045/14139
See application file for complete search history.

(56) References Cited

U.S. PATENT DOCUMENTS

2011/0187353 A1* 8/2011 Mizusaki ........... H03K 17/9505
324/207.11

FOREIGN PATENT DOCUMENTS

DE 19504608 3/2002
EP 2355355 8/2011
(Continued)

OTHER PUBLICATIONS

"Office Action of Japan Counterpart Application" with English translation thereof, dated Sep. 29, 2021, p. 1-p. 10.
(Continued)

*Primary Examiner* — Nahida Sultana
*Assistant Examiner* — Virak Nguon
(74) *Attorney, Agent, or Firm* — JCIPRNET

(57) ABSTRACT

Provided is a method of manufacturing a sensor. The sensor has a casing having an opening portion, a clamp having a recessed part on its outer periphery and having one end inserted into the opening portion, and a sealing ring attached to the recessed part and disposed between the casing and the clamp. The method includes using a first divided mold to form a first component of the clamp, the first component including a main body portion and a first part located at one end side of the main body portion and forming a part of the recessed part. The first divided mold is divided so that a dividing surface intersects the main body portion and separates in an axial direction of the main body portion.

7 Claims, 6 Drawing Sheets

(56) References Cited

FOREIGN PATENT DOCUMENTS

| | | | |
|---|---|---|---|
| JP | H0628958 | | 2/1994 |
| JP | H0875767 | | 3/1996 |
| JP | H0875767 A | * | 3/1996 |
| JP | 2006007764 | | 1/2006 |
| JP | 2010027515 | | 2/2010 |
| JP | 2012098173 | | 5/2012 |
| JP | 2012098173 A | * | 5/2012 |
| JP | 2014199740 | | 10/2014 |

OTHER PUBLICATIONS

"International Search Report (Form PCT/ISA/210) of PCT/JP2019/043416", dated Dec. 24, 2019, with English translation thereof, pp. 1-2.
"Written Opinion of the International Searching Authority (Form PCT/ISA/237) of PCT/JP2019/043416", dated Dec. 24, 2019, with English translation thereof, pp. 1-8.

* cited by examiner

METHOD OF MANUFACTURING SENSOR

CROSS-REFERENCE TO RELATED APPLICATION

This application is a 371 application of the International PCT application serial no. PCT/JP2019/043416, filed on Nov. 6, 2019, which claims the priority benefits of Japan Patent Application No. 2018-212390, filed on Nov. 12, 2018. The entirety of each of the above-mentioned patent applications is hereby incorporated by reference herein and made a part of this specification.

TECHNICAL FIELD

The present invention relates to a method of manufacturing a sensor.

DESCRIPTION OF RELATED ART

Hitherto, various sensors such as a proximity sensor or a photoelectric sensor have been used to detect the presence or absence of an object within a detection region. For example, a proximity sensor includes a coil that generates a magnetic field and detects the presence or absence of an object by measuring a change in impedance of the coil due to an induced current generated in an object having approached the coil. In addition, the photoelectric sensor detects the presence or absence of an object by emitting light into a detection region from a light projection part and analyzing light having passed through the object or reflected from the object by a light receiving part.

A sensor is manufactured by inserting an inner component such as a coil into a casing from an opening portion provided in the casing and then connecting a clamp part for protecting the inner component to the casing so as to cover the opening portion of the casing. The connection between the casing and the clamp may be performed by inserting a portion of the clamp into the casing. In this case, an O-ring may be disposed between the inner surface of the casing and the outer surface of the clamp in order to improve sealing properties by filling a gap between the casing and the clamp. For example, in Patent Literature 1, an O-ring is disposed between a housing and a body.

RELATED ART

Patent Literature

[Patent Literature 1]
Japanese Patent Laid-Open No. 2010-027515

SUMMARY

Technical Problem

However, a mold is used to manufacture a clamp, and thus a parting line or a burr may be generated on the outer surface of the clamp. When such a parting line or burr is formed in a region in contact with an O-ring on the outer surface of the clamp, the O-ring and the clamp may not adhere closely to each other appropriately, and thus there is a concern that sealing properties of a sensor may be poor.

Consequently, the present invention provides a method of manufacturing a sensor having good sealing properties.

Solution to Problem

A method of manufacturing a sensor according to an aspect of the present invention is a method of manufacturing a sensor that includes a cylindrical casing in which an opening portion is formed at one end and in which an electronic component is accommodated, a cylindrical clamp in which a recessed part having a sealing ring attached thereto is formed in an outer periphery and one end thereof is inserted into the opening portion, and the sealing ring which is attached to the recessed part and is disposed between the casing and the clamp, the method including a step of forming a first component of the clamp using a first divided mold, the first component including a cylindrical main body portion and a first part which is located on one end side of the main body portion and constitutes a portion of the recessed part, and the first divided mold having a dividing surface intersecting the main body portion and divided to be able to separate in an axial direction of the main body portion.

According to this aspect, the dividing surface of the first divided mold is located to intersect the outer surface of the main body portion and does not intersect the surface of the recessed part. That is, a parting line or a burr generated at a position intersecting the dividing surface during molding using the divided mold is not generated on the surface of the recessed part in which the sealing ring is disposed. For this reason, it is possible to appropriately make the sealing ring adhere closely to the surface of the recessed part and to manufacture a sensor having good sealing properties.

In the above-described aspect, the method of manufacturing a sensor may further include a step of forming a second component of the clamp constituting another portion of the recessed part using a second divided mold so that the second component is formed integrally with the first component, and providing the recessed part.

According to this aspect, the second component is formed integrally with the first component, and the first component and the second component can be treated as one component, and thus the components are easily managed.

In the above-described aspect, the first part includes a stepped part, and a step of bonding the second component may include a step of performing positioning of the second divided mold using the stepped part.

According to this aspect, a portion of the second divided mold abuts on a stepped part provided in the first part at the time of bonding the second component to the first component, and thus it is possible to easily perform the positioning of the second divided mold.

In the above-described aspect, the sealing ring may be an O-ring.

According to this aspect, in a case where the shape of the outer periphery of the recessed part is a circular shape, the sealing ring and the surface of the recessed part adhere closely to each other, and sealing properties of the sensor are improved.

In the above-described aspect, the first component and the second component may be formed of a resin.

According to this aspect, impact resistance and water resistance of the sensor are improved, and thus it is possible to prevent the sensor from being damaged or breaking down.

In the above-described aspect, the method of manufacturing a sensor may further include a step of filling one end side of the casing with a first resin, and a step of filling the other end side of the casing and a portion of the clamp with a second resin, and a gap may be provided between the first resin and the second resin.

According to this aspect, it is possible to prevent a liquid or dust from entering the sensor and prevent the sensor from breaking down by performing filling with the first resin or the second resin. In addition, an inner component such as a substrate is fixed by the casing or the clamp being filled with a resin, and thus it is possible to prevent a positional deviation. Further, a gap is provided between the first resin and the second resin. For this reason, it is possible to reduce the amount of resin which is used, as compared to a case where the entirety of the insides of the casing and the clamp is filled with a resin.

Effects

According to the present invention, it is possible to provide a method of manufacturing a sensor having good sealing properties.

DESCRIPTION OF THE EMBODIMENTS

Figure 1:
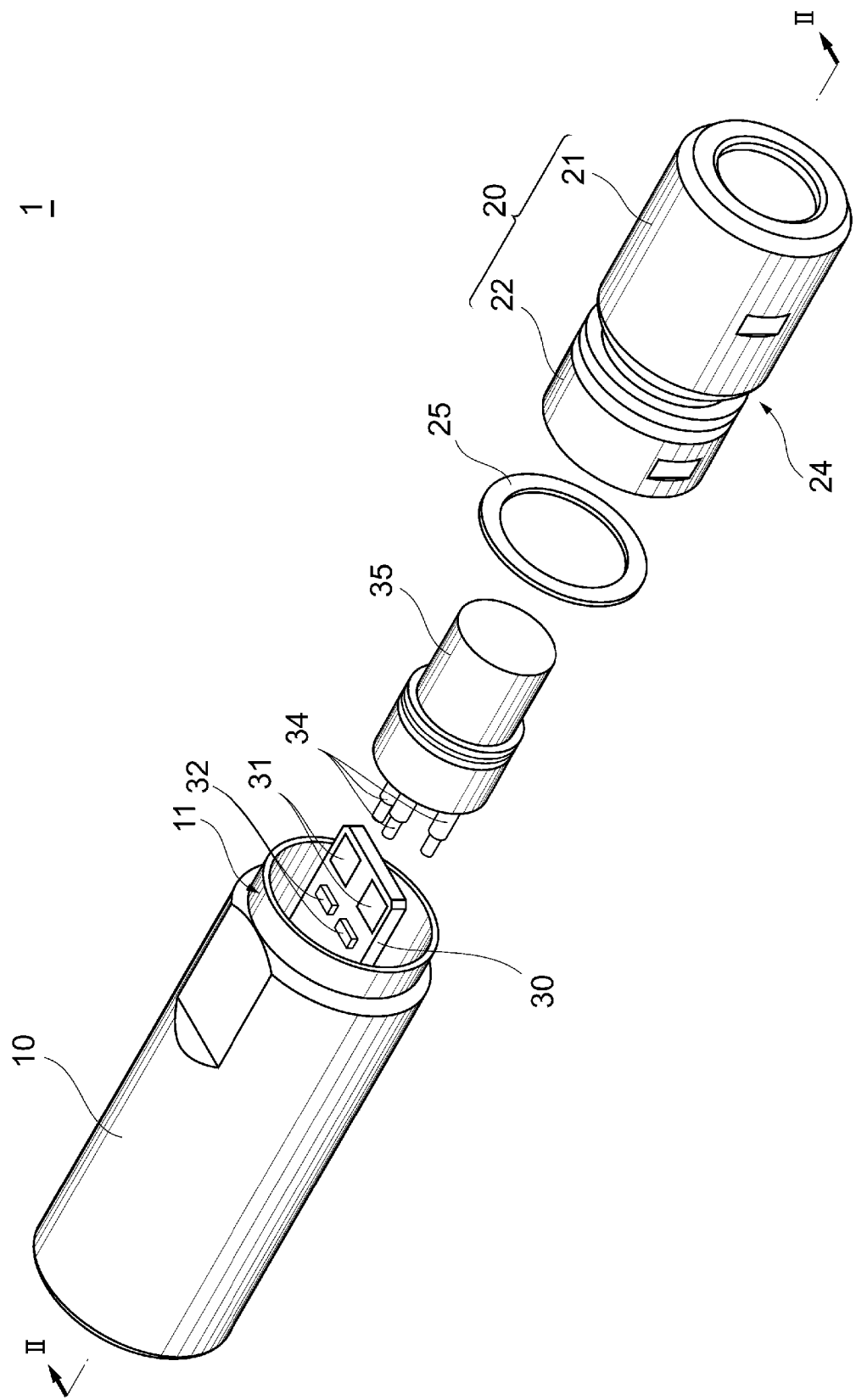
FIG. 1 is an exploded perspective view of a proximity sensor according to an embodiment of the present invention.

An embodiment of the present invention will be described with reference to the accompanying drawings. Meanwhile, in the drawings, components denoted by the same reference numerals and signs have the same or similar configurations.

FIG. 1 is an exploded perspective view of a proximity sensor 1 according to an embodiment of the present invention. In the present specification, a case where the present invention is applied to the proximity sensor 1 will be described as an example, but the present invention is not limited to the proximity sensor 1 and can be applied to various sensors such as a photoelectric sensor. In addition, FIG. 1 shows a cylindrical proximity sensor in which the outer periphery of the casing 10 or the clamp 20 has a circular shape, but the proximity sensor 1 may be a prismatic proximity sensor in which the outer periphery of the casing 10 or the clamp 20 has a polygonal shape. The proximity sensor 1 includes the casing 10, the clamp 20, a sealing ring 25, a substrate 30, a cable 34, and a protector 35.

The casing 10 is formed to have a circular cylindrical shape and accommodates electronic components, such as the substrate 30, therein. An opening portion 11 is provided on one end side of the casing 10, and one end of the clamp 20 is connected to the opening portion 11 after an electronic component is accommodated therein from the opening portion 11. The casing 10 may be formed of a metal, a resin, or the like.

The clamp 20 is connected to the casing 10, and protects an electronic component such as the substrate 30 accommodated in the casing 10. The clamp 20 includes a first component 21 and a second component 22. In the present embodiment, the clamp 20 is formed by bonding the first component 21 and the second component 22, which are formed to have a cylindrical shape, to each other. When a direction from the clamp 20 to the casing 10 is set to be forward and a direction from the casing 10 to the clamp 20 in the axial direction of the proximity sensor 1 is set to be backward, the first component 21 is located behind the second component 22.

The clamp 20 includes a recessed part 24 between the first component 21 and the second component 22, and the sealing ring 25 is attached to the recessed part. The first component 21 and the second component 22 may be formed of a resin, a metal, or the like. Meanwhile, in the present embodiment, a case where the first component 21 and the second component 22 are formed of a resin is described as an example. Further, the first component 21 and the second component 22 may be formed of a transparent material transmitting visible light and configured such that an indicating lamp 32 located inside the proximity sensor 1, and displaying an operating state of the proximity sensor 1 is visually recognized from the outside.

Figure 2:
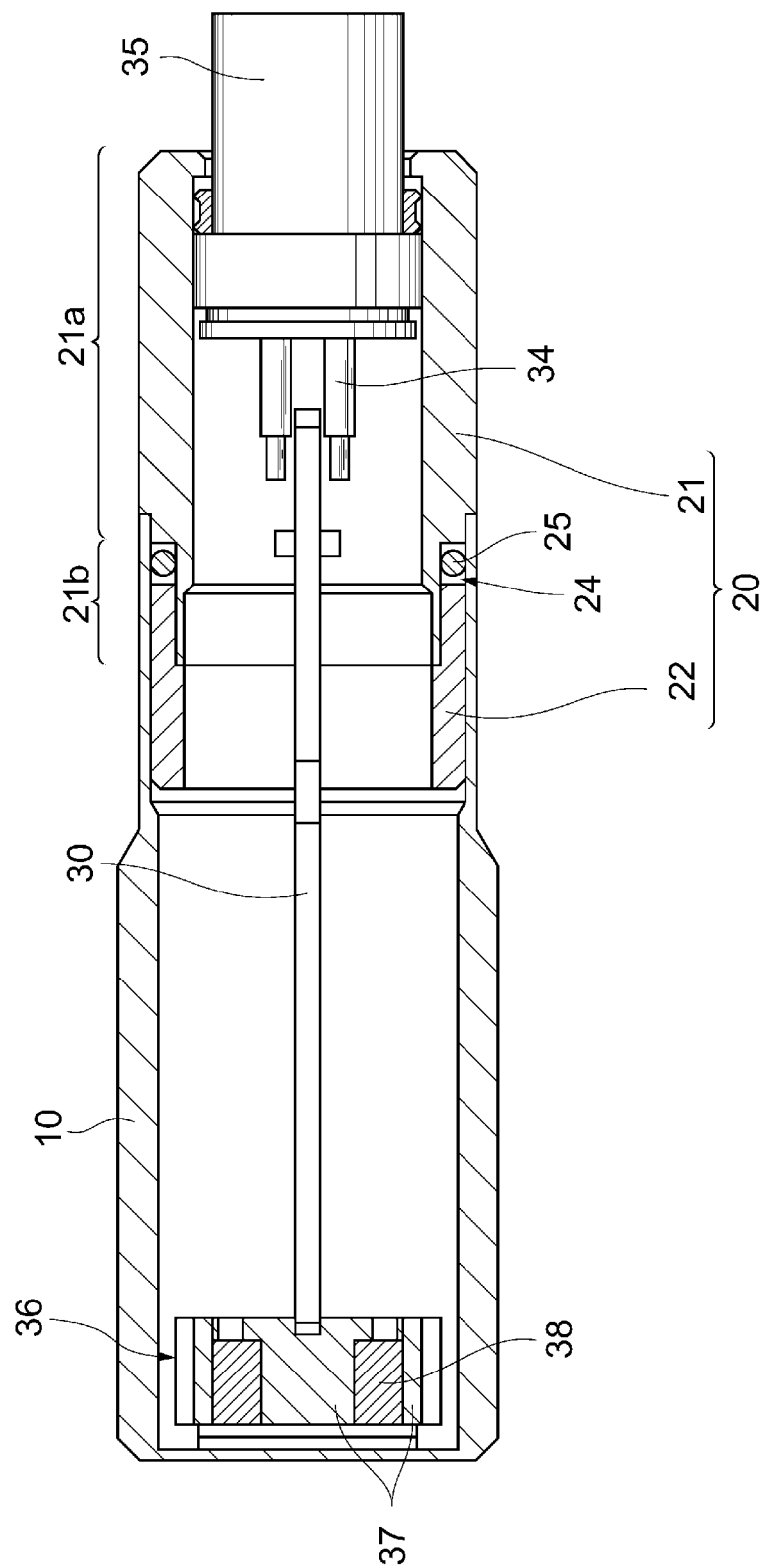
FIG. 2 is a cross-sectional view taken along a line of the proximity sensor shown in FIG. 1.

The sealing ring 25 is a member that seals in an electronic component accommodated in the proximity sensor 1. The sealing ring 25 is attached to the recessed part 24 of the clamp 20. As shown in FIG. 2, the sealing ring 25 is located between the outer surface of the clamp 20 and the inner surface of the casing 10 in a state where the clamp 20 is attached to the casing 10, and prevents liquid and dust from entering from between the clamp 20 and the casing 10.

The sealing ring 25 may be formed to have a shape conforming to the shape of the outer periphery of the recessed part 24. For example, in a case where the shape of the outer periphery of the recessed part 24 is a circular shape, the sealing ring 25 may be an O-ring. Thus, the sealing ring 25 and the surface of the recessed part 24 adhere closely to each other, and sealing properties of the proximity sensor 1 are improved.

The substrate 30 is a substrate on which a control circuit (not shown) controlling a detection part is mounted, and is partially accommodated in the casing 10. The substrate 30 may be a printed circuit board on which a circuit or a printed wiring, not shown in the drawing, is mounted. A detection part 36 is attached to one end on the front side of the substrate 30 as shown in FIG. 2. The control circuit mounted on the substrate 30 is electrically connected to the detection part and controls the operation of the detection part. In addition, a land 31 is provided at the other end of the substrate 30 and is electrically connected to the cable 34.

The cable 34 is electrically connected to the land 31 of the substrate 30. The cable 34 may supply a current supplied from an external power supply to the circuit mounted on the substrate 30. In addition, an electrical signal applied from the circuit mounted on the substrate 30 may be transmitted to an external apparatus. A protector 35 that protects the cable 34 is provided in the vicinity of the cable 34.

FIG. 2 is a cross-sectional view taken along a line II-II of the proximity sensor 1 shown in FIG. 1. Specifically, FIG. 2 is a cross-sectional view when the proximity sensor 1 is cut off by a surface orthogonal to the substrate 30. An internal structure of the proximity sensor 1 will be described using FIG. 2.

The detection part 36 is attached to one end of the substrate 30. The detection part 36 is electrically connected to the control circuit mounted on the substrate 30. The detection part 36 detects the presence or absence of an object in a detection region. The detection part 36 includes a core 37 having a coil 38 accommodated therein and the coil 38 wound annularly. When an object to be detected, such as a metal, approaches the coil 38 in a state where a magnetic field is generated in the coil 38, an induced current flows into the object. The detection part 36 measures a change in impedance of the coil 38 due to the induced current and detects the presence or absence of an object.

Meanwhile, a method of detecting an object by the detection part 36 is not limited to the above-described method. For example, the detection part 36 includes a light projection part that emits light, and a light receiving part that receives light, and may detect the presence or absence of an object by emitting light into the detection region from the light projection part, receiving light having passed through the object or reflected from the object by the light receiving part, and analyzing the light.

As shown in FIG. 2, the clamp 20 includes the cylindrical first component 21 and the second component 22. The first component 21 accommodates portions of the substrate 30, the cable 34, and the protector 35 therein. The first component 21 includes a main body portion 21a and a first part 21b. A direction from the clamp 20 to the casing 10 in the axial direction of the proximity sensor 1 is set to be forward and a direction from the casing 10 to the clamp 20 is set to be backward. In this case, the first part 21b is located in front of the main body portion 21a and is formed integrally with the main body portion 21a. In addition, the first part 21b is formed to have an outer diameter smaller than that of the main body portion 21a, and is formed such that a portion thereof is accommodated in the second component 22. However, a portion (a portion located between the main body portion 21a and the second component 22) on the rear side in the first part 21b is located outside the second component 22 without being covered with the second component 22. For this reason, as shown in FIG. 2, the recessed part 24 is formed between the first component 21 and the second component 22. The sealing ring 25 is attached to the recessed part 24.

Figure 3:
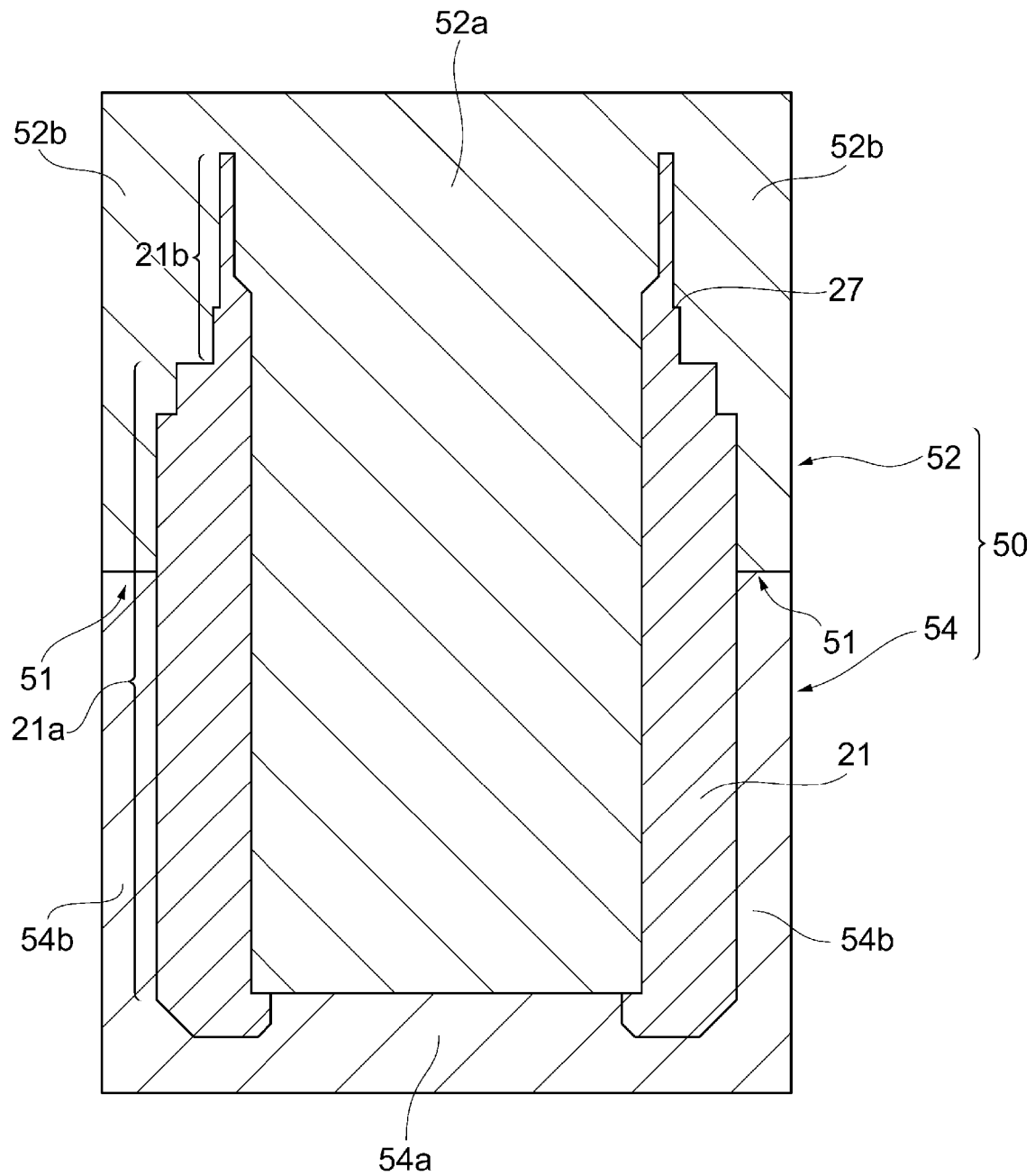
FIG. 3 is a cross-sectional view of a first component and a first divided mold.

FIG. 3 is a cross-sectional view of the first component 21 and a first divided mold 50. The first divided mold 50 which is used to form the first component 21 will be described with reference to FIG. 3. FIG. 3 shows a state where the first divided mold 50 is filled with a resin.

The first divided mold 50 includes an upper mold 52 and a lower mold 54. Meanwhile, in FIG. 3, a direction from the main body portion 21a to the first part 21b along the axial direction of the first component 21 is set to be an upward direction, and a direction from the first part 21b to the main body portion 21a is set to be a downward direction.

The upper mold 52 includes a shaft part 52a for forming the inner surface of the first component 21, and an outer peripheral part 52b located to surround the shaft part 52a and forming portions of the outer surface of the first part 21b and the outer surface of the main body portion 21a. In the present embodiment, the shaft part 52a and the outer peripheral part 52b are formed integrally.

The lower mold 54 includes a bottom part 54a which is in surface contact with the shaft part 52a of the upper mold 52, and an outer peripheral part 54b which is formed to have a wall shape erected from the outer periphery of the bottom part 54a and forms a portion of the outer surface of the main body portion 21a. The bottom part 54a and the outer peripheral part 54b are formed integrally.

A dividing surface 51 between the upper mold 52 and the lower mold 54 intersects the main body portion 21a as shown in FIG. 3. After the filling of a resin in the first divided mold. 50 is completed, the first divided mold 50 is divided to be separated in the axial direction of the main body portion 21a. Specifically, the first divided mold 50 is divided centering on the dividing surface 51 so that the upper mold 52 faces upward and the lower mold 54 faces downward.

Figure 4:
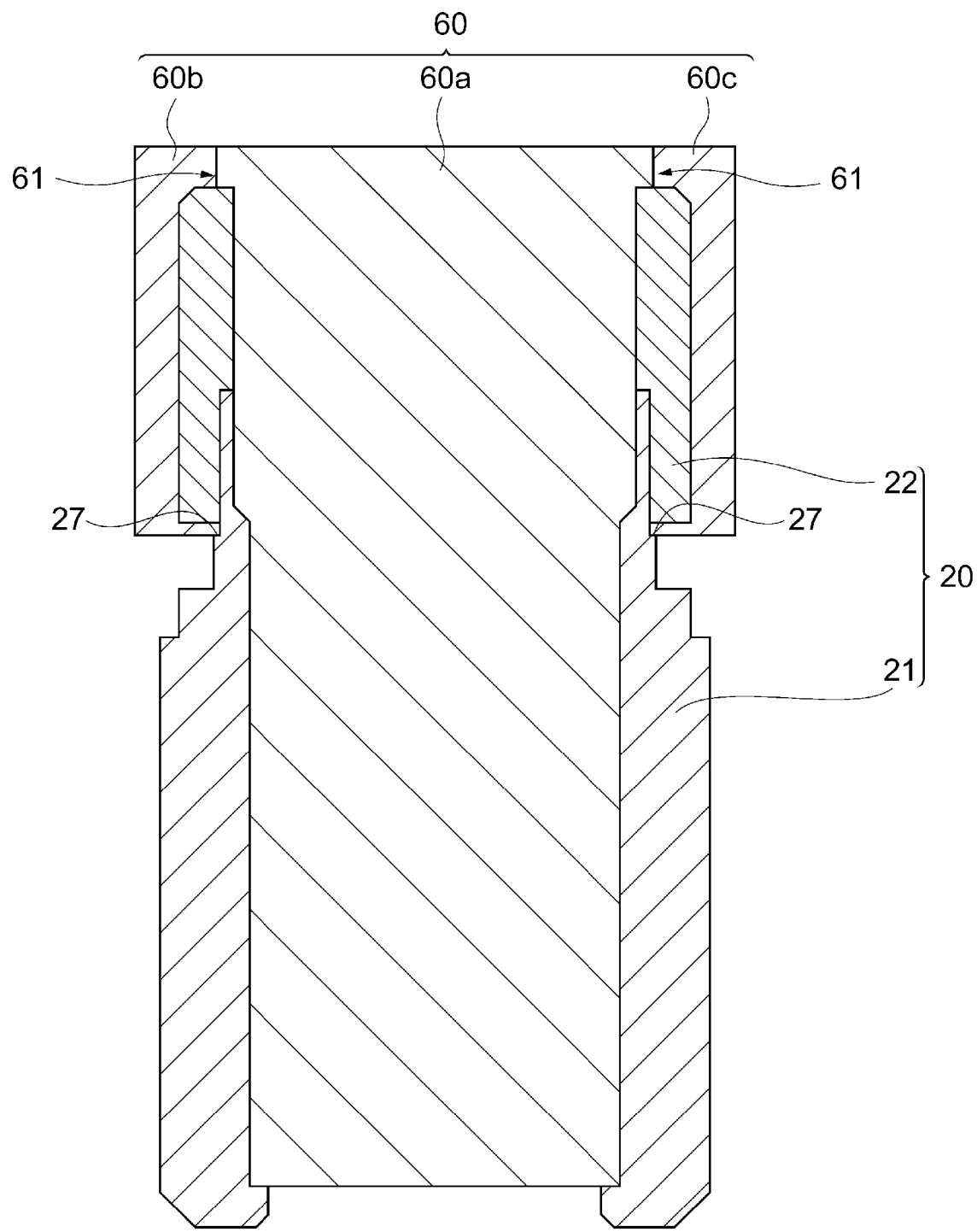
FIG. 4 is a cross-sectional view of a clamp and a second divided mold.

In addition, the first part 21b formed by the first divided mold 50 includes a stepped part 27 on the outer periphery thereof. As shown in FIG. 4, the stepped part 27 is used to perform positioning of a second divided mold 60 which is used when the second component 22 is bonded to the first component 21. Details will be described later using FIG. 4.

Meanwhile, as long as a dividing surface does not intersect a region which is in contact with the sealing ring 25 on the outer surface of the first component 21, the upper mold 52 and the lower mold 54 may be separated from each other at any position. In the present embodiment, a dividing surface is located inside the lower end of the main body portion 21a, and the upper mold 52 and the lower mold 54 are separated from each other in a vertical direction. In addition, the bottom part 54a of the lower mold 54 has a dividing surface in the axial direction of the main body portion 21a, and the lower mold 54 is separated in a horizontal direction in FIG. 3.

FIG. 4 is a cross-sectional view of the clamp 20 and the second divided mold 60. The second divided mold 60 which is used at the time of bonding the second component 22 to the first component 21 will be described with reference to FIG. 4. FIG. 4 shows a state where the second divided mold 60 is filled with a resin.

The second divided mold 60 includes a shaft part 60a, a left part 60b, and a right part 60c. The shaft part 60a is a cylindrical mold which is located on the inner side of the cylindrical clamp 20, and is used to form the inner surface of the second component 22. In addition, the left part 60b and the right part 60c are located to surround the shaft part 60a and is used to form the outer surface of the second component 22.

The second component 22 is formed using the second divided mold 60 on an upper end side of the first component 21 that has already been formed. Specifically, the second divided mold 60 is filled with a resin after the upper end (a portion of the first part 21b) of the first component 21 is inserted into the second divided mold 60, and thus the second component 22 is formed to cover a portion of the first component 21 inserted into the second divided mold 60. In addition, as described above, the stepped part 27 is formed on the outer surface of the first component 21. Positioning of the second divided mold 60 is performed so that the lower ends of the left part 60b and the right part 60c of the second divided mold 60 abut on the stepped part 27.

The second divided mold 60 is divided after the filling with a resin is completed. Specifically, a dividing surface 61 between the shaft part 60a and the left part 60b and a dividing surface 61 between the shaft part 60a and the right part 60c are along the axial direction of the clamp 20 and are orthogonal to an upper end face of the second component 22. For this reason, the left part 60b and the right part 60c are separated in a horizontal direction so as to be separated from the shaft part 60a. In addition, the shaft part 60a is pulled out upward.

Figure 5:
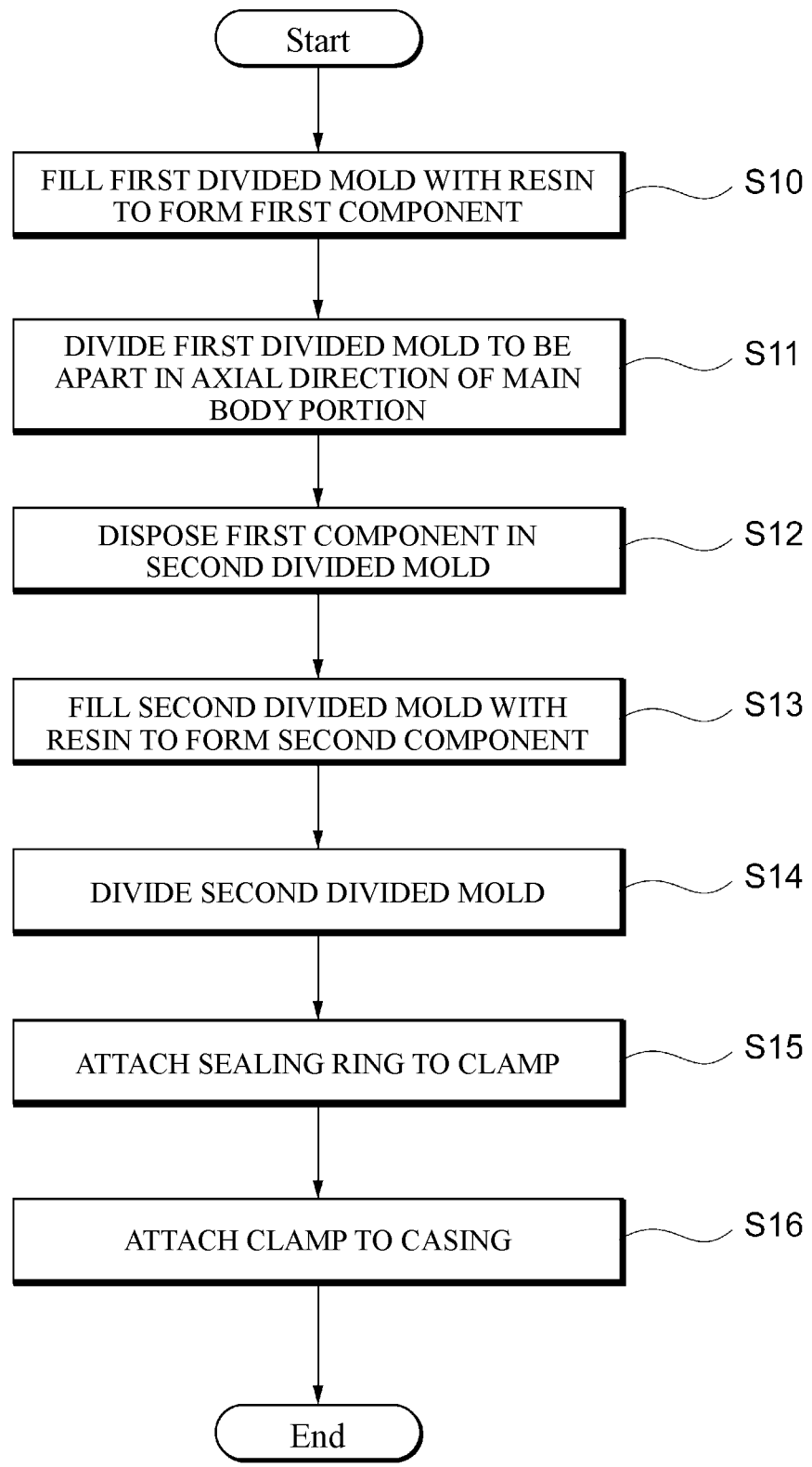
FIG. 5 is a flowchart showing a method of manufacturing the proximity sensor.

FIG. 5 is a flowchart showing a method of manufacturing the proximity sensor 1. A method of manufacturing the proximity sensor 1 will be described with reference to FIG. 5.

First, the first divided mold 50 is filled with a resin to form the first component 21 (step S10). Here, the first divided mold 50 is a mold in which the dividing surface 51 intersects the main body portion 21a, and may be, for example, the first divided mold 50 as shown in FIG. 3.

Thereafter, the first divided mold 50 is divided to be able to separate in the axial direction of the main body portion 21a (step S11). For example, the first divided mold 50 shown in FIG. 3 may be divided to pull out the upper mold 52 upward and pull out the lower mold 54 downward.

Subsequently, the first component 21 is disposed in the second divided mold 60 (step S12). For example, as shown in FIG. 4, a portion to be bonded to the second component 22 in the first component 21 (in the present embodiment, an upper end of the first component 21) is inserted into the second divided mold 60. In this case, positioning of the second divided mold 60 may be performed by making the lower ends of the left part 60b and the right part 60c of the second divided mold 60 abut on the stepped part 27 formed in the first component 21.

The second divided mold 60 is filled with a resin to form the second component 22 (step S13), As shown in FIG. 4, the second divided mold 60 may be a mold in which the dividing surface 61 is orthogonal to an upper end face of the second component 22.

Thereafter, the second divided mold 60 is divided (step S14). For example, the second divided mold 60 shown in FIG. 4 may be divided such that the left part 60b and the right part 60c are separated from the shaft part 60a in a horizontal direction. As described above, the manufacture of the clamp 20 is completed.

Subsequently, the sealing ring 25 is attached to the recessed part 24 provided at the outer periphery of the clamp 20 (step S15).

After electronic components such as the detection part 36 and the substrate 30 are accommodated in the casing 10 and the clamp 20, the clamp 20 is attached to the casing 10 (step S16). As shown in FIG. 2, the clamp 20 may be attached such that one end is inserted into the opening portion of the casing 10. As described above, the process of manufacturing the proximity sensor 1 is terminated.

According to the method of manufacturing the proximity sensor 1 of the present embodiment, the dividing surface 51 of the first divided mold 50 is located to intersect the outer surface of the main body portion 21a and does not intersect the surface of the recessed part 24. That is, a parting line or a burr generated during molding using the divided mold is not generated on the surface of the recessed part 24 in which the sealing ring 25 is disposed. For this reason, it is possible to appropriately make the sealing ring 25 adhere closely to the surface of the recessed part 24 and to manufacture the proximity sensor 1 having good sealing properties.

In addition, the first part 21b includes the stepped part 27 which is used for the positioning of the second divided mold 60. For example, when the second component 22 is bonded to the first component 21, it is possible to easily perform the positioning of the second divided mold 60 by making a portion of the second divided mold 60 abut on the stepped part 27 provided in the first part 21b.

Figure 6:
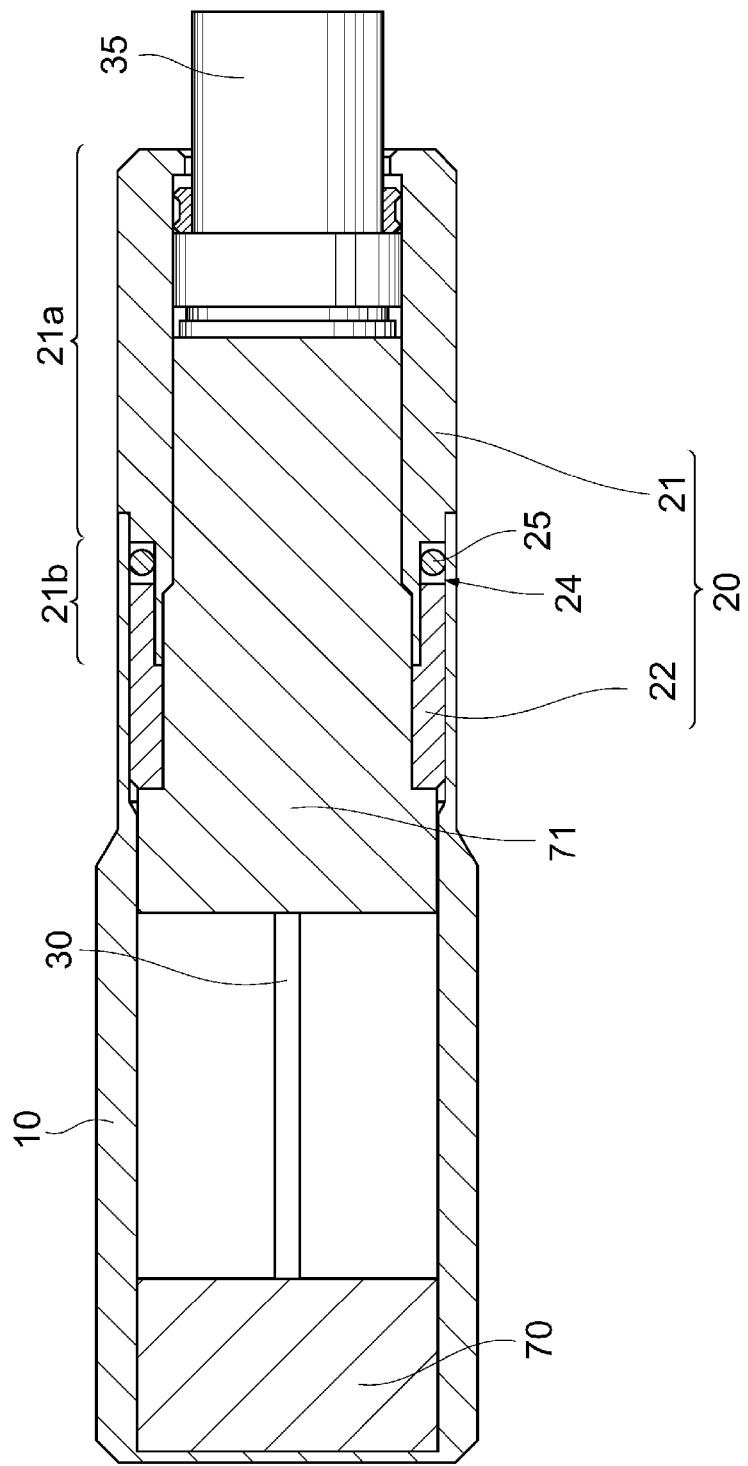
FIG. 6 is a cross-sectional view of the proximity sensor filled with a resin.

FIG. 6 is a cross-sectional view of the proximity sensor 1 filled with a resin. As shown in FIG. 6, the casing 10 and the clamp 20 of the proximity sensor 1 are filled with a first resin 70 and a second resin 71. In the present embodiment, the front of the casing 10 is filled with the first resin 70, and the first resin 70 covers the detection part 36. In addition, the first resin 70 also covers a portion of the substrate 30. Meanwhile, the first resin 70 may not cover the entire substrate 30.

In addition, as shown in FIG. 6, the rear of the casing 10 and a portion of the clamp 20 are filled with the second resin 71. The second resin 71 covers a portion of the substrate 30. Meanwhile, the second resin 71 may not cover the entire substrate 30. The detection part 36 and the substrate 30 are fixed by performing filling with the first resin 70 and the second resin 71, and thus it is possible to prevent a positional deviation. In addition, the second component 22 of the clamp 20 is located between the sealing ring 25 and the second resin 71. For this reason, it is possible to prevent adhesion to the sealing ring 25 of the second resin 71 at the time of performing filling with the second resin 71.

By performing filling with the first resin 70 and the second resin 71, it is possible to prevent a liquid or dust from entering the proximity sensor 1 and prevent the proximity sensor 1 from being broken down. A gap is provided between the first resin 70 and the second resin 71. For this reason, it is possible to reduce the amount of resin to be used, as compared to a case where the entirety of the insides of the casing 10 and the clamp 20 is filled with a resin.

The above-described embodiment is for facilitating the understanding of the present invention, and is not for limiting and analyzing the present invention. The components included in the embodiment, and the arrangement, materials, conditions, shapes, sizes, and the like thereof are not limited to those exemplified, and can be changed appropriately. In addition, configurations shown in different embodiments can be partially replaced or combined with each other.

What is claimed is:

1. A method of manufacturing a sensor that includes a cylindrical casing in which an opening portion is formed at one end and a detection part including a core having a coil is accommodated in another end and in which an electronic component is accommodated, a cylindrical clamp in which a recessed part having a sealing ring attached thereto is formed in an outer periphery and one end thereof is inserted into the opening portion, and the sealing ring which is attached to the recessed part and is disposed between the casing and the clamp, the method comprising:
   a step of forming a first component of the clamp using a first divided mold, the first component including a cylindrical main body portion and a first part which is located on one end side of the main body portion and constitutes a portion of the recessed part,
   wherein the first divided mold has a dividing surface intersecting the main body portion and is divided to be able to separate in an axial direction of the main body portion; and
   a step of forming a second component of the clamp constituting another portion of the recessed part using a second divided mold so that the second component is formed integrally with the first component, and providing the recessed part,
   wherein the second component is inserted into the opening portion.

2. The method of manufacturing a sensor according to claim 1, wherein
   the step of providing the recessed part includes a step of inserting a portion of the first part into the second divided mold and forming the second component to cover the inserted portion of the first part.

3. The method of manufacturing a sensor according to claim 1, wherein
   the first part includes a stepped part on an outer periphery, and
   the step of providing the recessed part includes a step of performing positioning of the second divided mold using the stepped part.

4. The method of manufacturing a sensor according to claim 1, wherein
   the dividing surface of the first divided mold is orthogonal to the axial direction of the main body portion.

5. The method of manufacturing a sensor according to claim 1, wherein
the sealing ring is an O-ring.

6. The method of manufacturing a sensor according to claim 1, wherein
the first component and the second component are formed of a resin.

7. The method of manufacturing a sensor according to claim 1, further comprising:
a step of filling one end side of the casing with a first resin; and
a step of filling the other end side of the casing and a portion of the clamp with a second resin, and
wherein a gap is provided between the first resin and the second resin.

* * * * *